United States Patent
Ishikawa et al.

(10) Patent No.: US 6,518,182 B1
(45) Date of Patent: Feb. 11, 2003

(54) VIA-FILLING PROCESS

(75) Inventors: Masami Ishikawa, Fujisawa (JP); Hideki Hagiwara, Fujisawa (JP); Ryoichi Kimizuka, Fujisawa (JP)

(73) Assignee: Ebara-Udylite Co., Ltd., Tokyo (JP)

( * ) Notice: Subject to any disclaimer, the term of this patent is extended or adjusted under 35 U.S.C. 154(b) by 129 days.

(21) Appl. No.: 09/709,331

(22) Filed: Nov. 13, 2000

(30) Foreign Application Priority Data

Nov. 12, 1999 (JP) .......................................... 11-322236

(51) Int. Cl.$^7$ .............................................. H01L 21/44
(52) U.S. Cl. ..................... 438/678; 427/523; 252/79.2; 205/87; 205/167
(58) Field of Search ................................ 438/674, 675, 438/760, 768, 700, 678, 780; 204/5, 25–30, 50–52; 252/79.1–79.4; 427/98, 523–531; 205/87, 133, 167

(56) References Cited

U.S. PATENT DOCUMENTS

| 3,767,539 A | * | 10/1973 | Clauss et al. | 204/52 |
| 4,038,161 A | * | 7/1977 | Eckles et al. | 204/52 |
| 4,316,778 A | * | 2/1982 | Whitehurst | 204/5 |
| 4,576,685 A | * | 3/1986 | Goffredo et al. | 204/30 |
| 4,781,801 A | * | 11/1988 | Frisby | 204/25 |
| 4,786,746 A | * | 11/1988 | Miljkovic | 560/302 |
| 5,587,006 A | * | 12/1996 | Shepherd et al. | 106/1.05 |

* cited by examiner

Primary Examiner—Matthew Smith
Assistant Examiner—Calvin Lee
(74) Attorney, Agent, or Firm—Oblon, Spivak, McClelland, Maier & Neustadt, P.C.

(57) ABSTRACT

A process of performing via-filling efficiently and by a simple procedure is disclosed. The via-filling process comprises providing a substrate having blind via-holes, making the substrate electrically conductive, and plating the substrate in an acid copper plating bath which comprises the following components (A) to (E):

(A) copper sulfate at a concentration of 100–300 g/L,
(B) copper sulfate at a concentration of 30–150 g/L,
(C) a first component (polymer component) such as polyethylene glycol, polypropylene glycol, and Pluronic surfactants, at a concentration of 10–1000 mg/L,
(D) a second component (carrier component) such as sodium sulfoalkyl sulfonates and bis-sulfo organic compounds at a concentration of 0.1–20 mg/L, and
(E) a third component (leveler component) such as polyalkylene imines, 1-hydroxyethyl-2-alkyl imidazoline chlorides, auramine and its derivatives at a concentration of 0.05–10 mg/L.

15 Claims, 1 Drawing Sheet

VIA-FILLING PROCESS

BACKGROUND OF THE INVENTION

1. Field of the Invention

The present invention relates to a via-filling process. More particularly, the present invention relates to a via-filling process for filling metals into minute pores such as blind holes provided in the substrate of printed circuit boards and the like.

2. Description of the Background Art

Recently, a build-up method is applied to mounting circuits for electronic equipment such as cellular phones, personal computers, videos, game machines, and the like. In the build-up method, small holes such as through-holes and via-holes are provided in a laminated board, and metals are deposited in such small holes to allow interconnection among several different circuit layers. Of these small holes, via-holes which are minute blind holes are plated with metals (via-hole plating) or filled with metals (via-filling) for interconnecting the layers.

With via-hole plating, in which a metal film is formed on the side or bottom in side the via-holes, there are difficulties in layering a conductive layer over the holes. In addition, the area of metal film deposition must be increased to guarantee conductivity in the interconnection. On the other hand, the via-filling process in which metals are filled into via-holes can completely fill the holes with the metals and allow the other holes to be formed on these holes if these are flat after via-filling. Therefore, this process is advantageous for downsizing the devices. For this reason, the demand is shifted from the via-hole plating process which is limited to flattening of insulating materials to the via-filling process in which interlayer holes can be filled.

Conventionally, via-filling is performed by activating the conductive layer in the bottom of an insulating layer in which holes are formed, forming pillars or posts by electrolytic copper plating, and flattening the surface by removing deposited copper by grinding. Another method comprises activating only the conductive layer in the bottom by electroless copper plating and selectively piling by electroless copper plating. Of these methods, the former method requires grinding of deposited copper plating layers having a substantial thickness, whereas the latter method has a drawback of requiring a considerable period of time to obtain a copper plating layer with a desired thickness.

Accordingly, an object of the present invention is to provide a process of efficiently performing via-filling by means of a simple procedure.

The present inventors have conducted extensive studies on acid copper plating baths which can efficiently perform via-filling and, as a result, have found that a bath with a high copper sulfate concentration and a low sulfuric acid concentration is suitable for filling in blind via-holes with plating.

Although a typical conventional sulfuric acid copper plating bath for printed circuit boards contains about 75 g/L of copper sulfate and 180 g/L of sulfuric acid, a composition containing about 225 g/L of copper sulfate and about 55 g/L of sulfuric acid which is used for copper plating for ornamental purposes has been found more suitable for filling in blind via-holes.

However, this composition impairs properties of printed circuit boards, such as elongation rate and tensile strength of the copper plating film, or increases fluctuation of the plating thickness, even if additives for printed circuit boards are used.

As a result of extensive studies to remove drawbacks such as impaired properties using this composition, the present inventors have found that an acid copper plating bath having the same properties as the conventional bath for printing circuit boards and exhibiting superior via-filling properties (hole filling) can be obtained by adjusting the proportion of the additives and that copper can be preferentially deposited in via-holes of print-circuit boards and the like using this bath composition.

SUMMARY OF THE INVENTION

Specifically, the present invention provides a via-filling process comprising providing a substrate having blind via-holes, making the substrate electrically conductive, and plating the substrate in an acid copper plating bath which comprises the following components (A) to (E):

(A) copper sulfate at a concentration of 100–300 g/L, (B) Sulfuric acid at a concentration of 30–150 g/L, (C) a first component selected from the group consisting of polypropylene glycol, Pluronic surfactants, Tetronic surfactants, polyethylene glycol glyceryl ether, and polyethylene glycol dialkyl ethers at a concentration of 10–1000 mg/L, (D) a second component selected from the group consisting of sodium sulfoalkyl sulfonates, bis-sulfo organic compounds, and dithiocarbamic acid derivatives at a concentration of 0.1–20 mg/L, and (E) a third component selected from the group consisting of polyalkylene imines, 1-hydroxyethyl-2-alkyl imidazoline chlorides, auramine and its derivatives, methyl violet and its derivatives, crystal violet and its derivatives, and Janus black and its derivatives at a concentration of 0.05–10 mg/L.

Other objects, features and advantages of the invention will herein after become more readily apparent from the following description.

DETAILED DESCRIPTION OF THE INVENTION AND PREFERRED EMBODIMENTS

Figure 1:
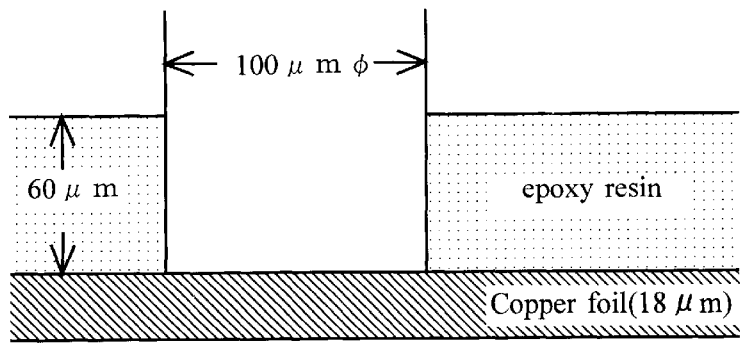
FIG. 1 schematically shows a blind via-hole on a printed circuit board used in Example 1.

In carrying out the present invention, a substrate having blind via-holes is first made electrically conductive.

Printed circuit boards to which the via-filling process of the present invention is applied have via-holes with a diameter of 50–200 $\mu$m and a depth (the resin layer thickness) of 30–100 $\mu$m. Examples of such printed circuit boards are package substrates on which IC bare chips are directly mounted. Such substrates may have through-holes in addition to via-holes, and may further include trenches.

As a method of making the substrate electrically conductive, a conventional method such as an electroless metal plating method or a sputtering method can be employed.

The substrate which have been made electrically conductive is plated with copper using the acid copper plating bath which contains the above components (A) to (E). The concentration of copper sulfate which is the component (A) in the acid copper plating bath is 100–300 g/L, and preferably 180–250 g/L. The concentration of sulfuric acid which is the component (B) is 30–150 g/L, and preferably 40–80 g/L. The amount of these components (A) and (B) is the same as in the conventional copper sulfate plating bath for ornamental purposes. Chlorine ions are preferably present in addition to the components (A) and (B) at a concentration of 20–100 mg/L, and preferably 40–80 mg/L as chlorine.

The first component which is the component (C) in the present invention is called a polymer component and includes the following components.

(1) Polypropylene glycols shown by the following formula (I).

(I)

wherein n1 represents a numeral from 1 to 20.

(2) Pluronic surfactants shown by the following formula (II).

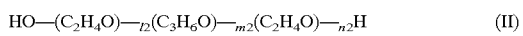
(II)

wherein n2 and l2 individually represent a numeral from 1 to 30, and m2 represents a numeral from 10 to 100.

(3) Tetronic surfactants shown by the following formula (III).

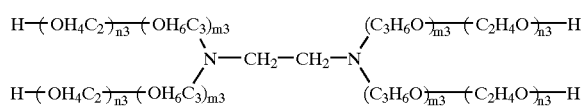
(III)

wherein n3 represents a numeral from 1 to 200 and m3 represents a numeral from 1 to 40.

(4) Polyethylene glycol glyceryl ethers shown by the following formula (IV).

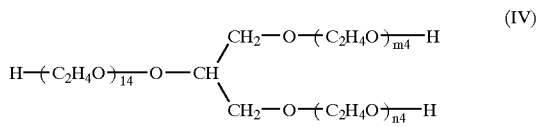
(IV)

wherein n4, m4, and l4 individually represent a numeral from 1 to 200.

(5) Polyethylene glycol dialkyl ether shown by the following formula (V).

(V)

wherein $R_1$ and $R_2$ individually represent a hydrogen atom or a lower alkyl group having 1–5 carbon atoms, and n5 represents a numeral from 2 to 200.

The above polymers may be used either individually or in combination of two or more as the component (C) at a concentration of about 10–1000 mg/L, and preferably about 50–300 mg/L.

The second component which is the component (D) in the present invention is generally called a carrier component and includes the following components.

(1) Sulfoalkyl sulfonates shown by the following formula (VI)

(VI)

wherein $L_1$ represents a saturated or unsaturated alkylene group having 1–18 carbon atoms and $M_1$ represents an alkali metal.

(2) Bis-sulfo compounds shown by the following formula (VII)

(VII)

wherein $L_2$ and $L_3$ individually represent a saturated or unsaturated alkylene group having 1–18 carbon atoms, and $X_1$ and $Y_1$ individually represents a sulfate or phosphate residue.

(3) Dithiocarbamic acid derivatives shown by the following formula (VIII)

(VIII)

wherein $R_3$ and $R_4$ individually represent a hydrogen atom or a lower alkyl group having 1–3 carbon atoms, $L_4$ represents an alkylene group having 3–6 carbon atoms, and $X_2$ represents a sulfate or phosphate residue.

These compounds may be used either individually or in combination of two or more as the component (D) at a concentration of about 0.1–20 mg/L, and preferably about 0.5–5 mg/L.

The third component which is the component (E) in the present invention is generally called a leveler component and includes the following compounds.

(1) Polyalkyl imines shown by the following formula (IX).

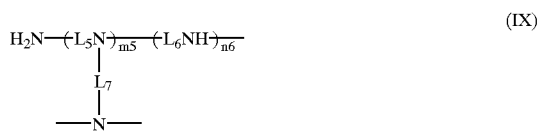
(IX)

wherein $L_5$, $L_6$, and $L_7$ individually represent a hydrogen atom or a lower alkyl group having 1–3 carbon atoms, and n6 and m5 individually represent a numeral from 1 to 200.

(2) Salts of 1-hydroxyethyl-2-alkyl imidazoline shown by the following formula (X)

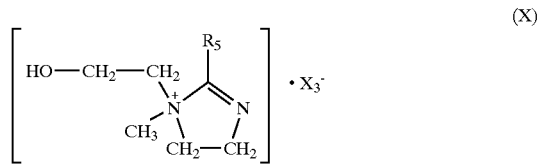
(X)

wherein $R_5$ represents a saturated or unsaturated alkyl group having 14–20 carbon atoms and $X_3$ represents a halogen atom.

(3) Auramine and its derivatives shown by the following formula (XI)

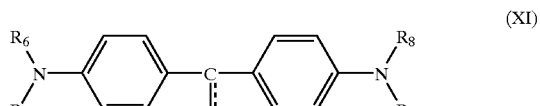
(XI)

wherein $R_6$, $R_7$, $R_8$, and $R_9$ individually represent a hydrogen atom or a lower alkyl group having 1–3 carbon atoms.

(4) Methyl violet, crystal violet, and their derivatives shown by the following formula (XII)

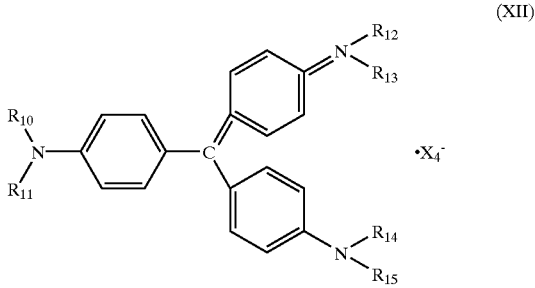

wherein $R_{10}$, $R_{11}$, $R_{12}$, $R_{13}$, $R_{14}$, and $R_{15}$ individually represent a hydrogen atom or a lower alkyl group having 1–3 carbon atoms, and $X_4$ represents a halogen atom.

(5) Janus black and its derivatives shown by the following formula (XIII)

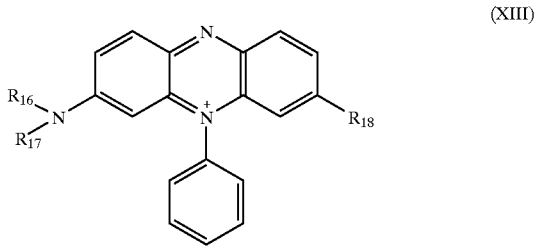

wherein $R_{16}$ and $R_{17}$ individually represent a lower alkyl group, $R_{18}$ represents a hydroxyl group, amino group, hydroxyphenyl group, or hydroxyphenyldiazo group, and $X_5$ represents a halogen atom.

The above compounds may be used either individually or in combination of two or more as the component (E) at a concentration of about 0.05–10 mg/L, and preferably about 0.1–2 mg/L.

Electrolysis conditions used for a conventional copper sulfate plating by direct current or PR current may be applied to the electrolysis for copper plating using the above acid copper plating solution. Specific conditions may be a bath temperature between 23–27° C. and a current density of about 1–3 A/dm². Air agitation is preferably applied during electrolysis.

The time required for blind via-holes to be completely filled using the process of the present invention described above varies according to the diameter and depth of the via-holes. For example, via-holes having a diameter of 100 μm and a depth of 50 μm may require plating for about 60 minutes at a current density of about 2.0 A/dm², whereby plating with a thickness of about 20 μm is produced on the surface (excluding the areas of the via-holes).

Other features of the invention will become apparent in the course of the following description of the exemplary embodiments which are given for illustration of the invention and are not intended to be limiting thereof.

EXAMPLES

The present invention will be described in more detail by way of Examples which should not be construed as limiting the present invention.

Example 1

Blind via-holes having a diameter of 100 μm and a depth of 60 μm were produced on an epoxy resin coated copper printed board. The printed board was first subjected to electroless copper plating to form an electroless copper layer with a thickness of 5 μm on the inner wall of via-holes and the surface of the board (this step is hereinafter called "conductivity processing"). Lyzatron process (Ebara-Udylite Co., Ltd.) was used for the electroless copper plating.

After the conductivity processing, the printed board with blind via-holes was subjected to copper sulfate plating using the following three plating baths at a cathode current density of 2 A/dm², thereby forming an electro copper layer. The Comparative Plating Bath 1 used here is a composition prepared by adding additives which are commonly used for copper sulfate plating for printed circuit boards to a conventional copper sulfate plating for ornamental purposes.

The thickness of copper plating on the surface and the ratio of the hole volume filled with copper was examined using a microscope at 45 minutes, 60 minutes, and 75 minutes after the start of plating. The results are shown in Table 1.

Figure 2:
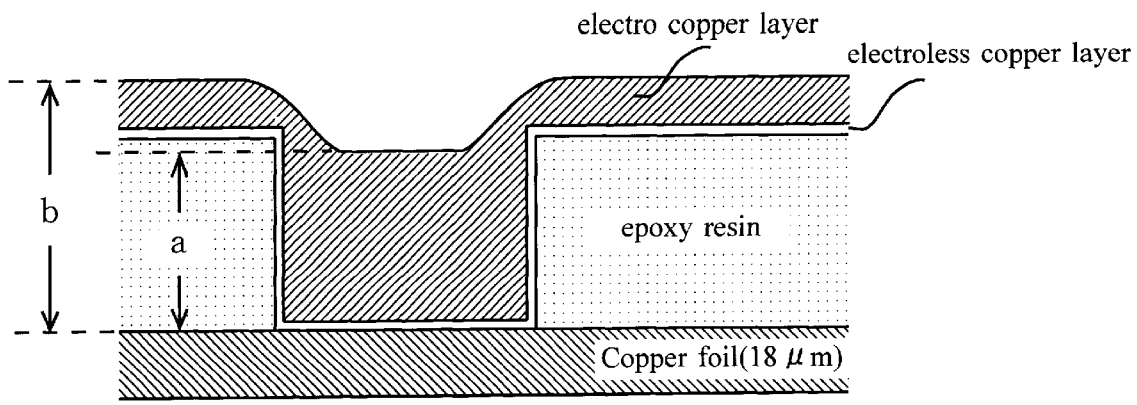
FIG. 2 is a drawing for showing the method of determining the ratio of a hole filled with copper plating.

The ratio of the hole volume filled with copper (filled ratio) is a ratio (in percentage) determined by dividing the plated thickness in the hole from the bottom (a) by distance from the bottom of the hole to the plated surface (b) shown in FIG. 2.

(Copper Sulfate Plating Bath Composition)

Plating Bath 1 of the Present Invention

| | |
|---|---|
| Copper sulfate | 225 g/L |
| Sulfuric acid | 55 g/L |
| Chloride ion | 60 mg/L |
| Pluronic L64* | 100 mg/L |
| Auramine** | 2 mg/L |
| SPS+ | 5 mg/L |

*Manufactured by Asahi Denka Kogyo Co., Ltd.
**The compound with $R_6 = R_7 = R_8 = R_9 = CH_3$ in the formula (XI)
+The compound with $L_2 = L_3 = C_3H_6$ and $X_1 = Y_1 = $ —$SO_3H$ in the formula (VII)

Plating Bath 2 of the Present Invention

| | |
|---|---|
| Copper sulfate | 100 g/L |
| Sulfuric acid | 150 g/L |
| Chloride ion | 60 mg/L |
| Pluronic L64* | 100 mg/L |
| Auramine** | 2 mg/L |
| SPS+ | 5 mg/L |

*, **, +: The same as above.

Comparative Plating Bath 1

| | |
|---|---|
| Copper sulfate | 225 g/L |
| Sulfuric acid | 55 g/L |
| Chloride ion | 60 mg/L |
| Cu-Brite TH++ | 5 ml/L |

++Manufactured by Ebara-Udylite Co., Ltd.

(Results)

TABLE 1

| Plating time (min) | Surface plating thickness (μm) | Hole filling rate (%) | | |
|---|---|---|---|---|
| | | Plating Bath 1 | Plating Bath 2 | Comparative Plating Bath 1 |
| 45 | 15 | 85 | 70 | 20 |
| 60 | 20 | 100 | 90 | 25 |
| 75 | 25 | 100 | 100 | 30 |

As can be understood from the above results, the plating thickness in the blind via-holes was naturally equivalent to or slightly thinner than the plating thickness of the surface if plated using the Comparative Plating Bath 1 which has been conventionally used as a common copper sulfate plating bath. In contrast, it was possible to fill in holes with copper to a depth of 60 μm when the surface plating thickness is 20–25 μm by using the plating baths of the present invention.

Example 2

Hole filling capability was examined in the same manner as in Example 1 using the Plating Bath 3 of the present invention except that the diameter of the blind via-holes was changed. The results are shown in Table 2.
(Copper Sulfate plating Bath Composition)
Plating Bath 3 of the Present Invention

| Copper sulfate | 225 g/L |
|---|---|
| Sulfuric acid | 55 g/L |
| Chloride ion | 60 mg/L |
| Tetronic TR704* | 200 mg/L |
| Janus black** | 1 mg/L |
| MPS+ | 0.5 mg/L |

*Manufactured by Asahi Denka Kogyo Co., Ltd.
**The compound with $R_{16} = R_{17} = C_2H_5$, $R_{18}$ = hydroxyphenyldiazo group, $X5 = Cl^-$ in the formula (XIII)
+The compound with $L_1 = C_3H_6$ and $M_1$ = Na in the formula (VI)

(Results)

TABLE 2

| Plating time (min) | Surface plating thickness (μm) | Hole filling rate (%) | | | | |
|---|---|---|---|---|---|---|
| | | 200 μm hole | 100 μm hole | 80 μm hole | 60 μm hole | 50 μm hole |
| 45 | 15 | 85 | 90 | 90 | 85 | 70 |
| 60 | 20 | 90 | 100 | 100 | 95 | 80 |
| 75 | 25 | 95 | 100 | 100 | 100 | 90 |

As can be seen from the above results, a hole with a diameter in the range from 80 to 100 μm for a depth of 60 μm (aspect ratio: 1.0–0.8) exhibited the most efficient hole filling capability. The hole filling capability decreased if the diameter was either larger or smaller than that range.

Example 3

Deposited copper film properties are important in copper plating for print-circuit boards. In this example, properties of the copper film obtained using the plating bath of the present invention were compared with copper films obtained using a common plating bath for printed circuit boards (Comparative Bath 2) and a plating bath for ornamental purpose (Comparative Bath 3). Copper plating with a thickness of 50 μm was formed on stainless steel plates using the above plating baths. The plating films were peeled off from the stainless steel plates to prepare test specimens with a width of 10 mm, which were submitted for the measurement of elongation and tensile strength using a tensile tester. The results are shown in Table 3.
(Copper Sulfate Plating Bath Composition)
Plating Bath 1 of the Present Invention

| Copper sulfate | 225 g/L |
|---|---|
| Sulfuric acid | 55 g/L |
| Chloride ion | 60 mg/L |
| Pluronic L64* | 100 mg/L |
| Polyethylene glycol dialkyl ether** | 100 mg/L |
| Auramine+ | 2 mg/L |
| SPS++ | 5 mg/L |

*Manufactured by Asahi Denka Kogyo Co., Ltd.
**The compound with $R_1 = R_2 = C_3H_7$ in the formula (V)
+The compound with $R_6 = R_7 = R_8 = R_9 = CH_3$ in the formula (XI)
++The compound with $L_2 = L_3 = C_3H_6$ and $X_1 = Y_1 = -SO_3H$ in the formula (VII)

Comparative Plating Bath 2 (for Printed Circuit Boars)

| Copper sulfate | 75 g/L |
|---|---|
| Sulfuric acid | 180 g/L |
| Chloride ion | 60 mg/L |
| Cu-Brite TH# | 5 ml/L |

Manufactured by Ebara-Udylite Co., Ltd.

Comparative Plating Bath 3 (for Ornamentation)

| Copper sulfate | 225 g/L |
|---|---|
| Sulfuric acid | 55 g/L |
| Chloride ion | 60 mg/L |
| Polyethylene glycol 4000 | 100 mg/L |
| SPS++ | 1 mg/L |
| Thiourea | 0.1 mg/L |
| Janus green## | 0.1 mg/L |

**The same as the plating bath of the present invention
Manufactured by Wako Pure Chemical Industries Co., Ltd.

(Results)

TABLE 3

| Plating Bath | Elongation (%) | Tensile Strength (kg/mm$^2$) |
|---|---|---|
| Plating Bath 1 | 19 | 28 |
| Comparative Plating Bath 2 | 20 | 27 |
| Comparative Plating Bath 3 | 6 | 25 |

As can be seen from the above results, the copper plating film obtained using the plating bath of the present invention was confirmed to have the same superior properties with the copper plating film obtained using the conventional plating bath for printed circuit boards.

On the other hand, the plating bath (Comparative Plating Bath 3) prepared by adding common additives to the plating bath for ornamentation with the same copper and sulfuric acid concentrations as the plating bath of the present invention produced copper plating film exhibiting inferior properties and only low applicability to substrates for printed circuit and the like, even though the bath exhibited adequate hole filling capability. In this manner, the bath suitable for use for via-filling significantly depends also on the combination of additive compositions.

Example 4

Figure 3:
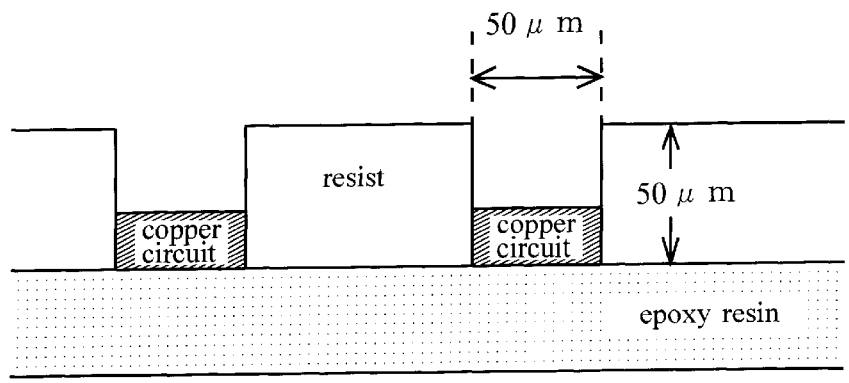
FIG. 3 schematically shows trenches in a resist on the substrate used in Example 4.

Because blind via-holes are provided on pattern substrates in many cases, the capability of the plating baths of filling in trenches on the pattern substrates as well as via-holes was tested. Plating was applied to a pattern substrate with trenches for copper circuits, with a width of 50 μm and a depth (thickness of the resist) of 50 μm, shown in FIG. 3, using the plating baths of the present invention (Example 1 and Example 3) and Comparative Bath 2 (Example 3) to examine if the trenches can be filled to the same level as the surrounding resist.

The test basically differs from the hole filling test in that resist walls are insulating and no conductive processing such as application of electroless copper plating has been performed. Specifically, in the case of the hole filling test plating copper is deposited on the entire inner surface of the holes which had been made conductive, whereas copper deposits only on the copper circuit surface which is the bottom of the trenches in the case of pattern plating.

(Results)

Table 4 shows the thickness of copper plating on the surface and the ratio of the trench volume filled with copper when copper sulfate plating was performed for a prescribed period of time using each plating bath at a cathode current density of 2 A/dm$^2$.

TABLE 4

| Plating time (min) | Surface plating thickness (μm) | Trench filling rate (%) | |
| --- | --- | --- | --- |
| | | Plating Bath 1 | Comparative Plating Bath 2 |
| 45 | 15 | 70 | 30 |
| 60 | 20 | 80 | 40 |
| 75 | 25 | 95 | 50 |
| 90 | 30 | 100 | 60 |

As can be seen from the above results, the thickness of plating in pattern trenches only becomes equivalent to or slightly thinner than the surface by copper plating using a plating bath for printed circuit boards, whereas the plating bath of the present invention could fill in 50 μm deep trenches with plating having a surface thickness of 30 μm.

Obviously, numerous modifications and variations of the present invention are possible in light of the above teachings. It is therefore to be understood that, within the scope of the appended claims, the invention may be practiced otherwise than as specifically described herein.

What is claimed is:

1. A via-filling process comprising providing a substrate having blind via-holes, making the substrate electrically conductive, and plating the substrate in an acid copper plating bath which comprises the following components (A) to (E):

(A) copper sulfate at a concentration of 100–300 g/L, (B) Sulfuric acid at a concentration of 30–150 g/L, (C) a first component selected from the group consisting of polypropylene glycol, Pluronic surfactants, Tetronic surfactants, polyethylene glycol glyceryl ether, and polyethylene glycol dialkyl ethers at a concentration of 10–1000 mg/L, (D) a second component selected from the group consisting of sodium sulfoalkyl sulfonates, bis-sulfo organic compounds, and dithiocarbamic acid derivatives at a concentration of 0.1–20 mg/L, and (E) a third component selected from the group consisting of polyalkylene imines, 1-hydroxyethyl-2-alkyl imidazoline chlorides, auramine and its derivatives, methyl violet and its derivatives, crystal violet and its derivatives, and Janus black and its derivatives at a concentration of 0.05–10 mg/L.

2. The via-filling process according to claim 1, wherein the substrate is made electrically conductive by electroless metal plating or sputtering.

3. The via-filling process according to claim 1, wherein the chlorine concentration in the acid copper plating bath is 20–100 mg/L.

4. The via-filling process according to claim 3, wherein the chlorine concentration is 40–80 mg/L.

5. The via-filling process according to claim 1, wherein the sulfuric acid is at a concentration of 40–80 g/L.

6. The via-filling process according to claim 1, wherein the copper sulfate is at a concentration of 180–250 g/L.

7. The via-filling process according to claim 1, wherein the first component (C) is at a concentration of about 50–300 mg/L.

8. The via-filling process according to claim 1, wherein the second component (D) is at a concentration of about 0.5–5 mg/L.

9. The via-filling process according to claim 1, wherein the third component (E) is at a concentration of about 0.1–2 mg/L.

10. The via-filling process according to claim 1, wherein the first component (C) is a Pluronic surfactant.

11. The via-filling process according to claim 1, wherein the first component (C) is a Tetronic surfactant.

12. The via-filling process according to claim 1, wherein the second component (D) is a sodium sulfoalkyl sulfonate.

13. The via-filling process according to claim 1, wherein the second component (D) is a bis-sulfo organic compound.

14. The via-filling process according to claim 1, wherein the third component (E) is an auramine or its derivative.

15. The via-filling process according to claim 1, wherein the third component (E) is Janus black or its derivative.

* * * * *